(12) United States Patent
Rahim et al.

(10) Patent No.: US 8,289,755 B1
(45) Date of Patent: Oct. 16, 2012

(54) VOLATILE MEMORY ELEMENTS WITH SOFT ERROR UPSET IMMUNITY

(75) Inventors: Irfan Rahim, Milpitas, CA (US);
Jeffrey T. Watt, Palo Alto, CA (US);
Andy L. Lee, San Jose, CA (US);
Myron Wai Wong, Fremont, CA (US);
William Bradley Vest, San Jose, CA (US)

(73) Assignee: Altera Corporation, San Jose, CA (US)

( * ) Notice: Subject to any disclaimer, the term of this patent is extended or adjusted under 35 U.S.C. 154(b) by 416 days.

(21) Appl. No.: 12/571,346

(22) Filed: Sep. 30, 2009

Related U.S. Application Data

(60) Provisional application No. 61/102,003, filed on Oct. 1, 2008, provisional application No. 61/113,573, filed on Nov. 11, 2008.

(51) Int. Cl.
*G11C 11/00* (2006.01)

(52) U.S. Cl. . 365/156; 365/154; 365/188; 365/189.011; 365/189.15; 365/189.16; 365/189.08; 365/202; 365/206

(58) Field of Classification Search .................. 365/154, 365/156, 188, 189.011, 189.15, 189.16, 189.08, 365/202, 206
See application file for complete search history.

(56) References Cited

U.S. PATENT DOCUMENTS

| 4,805,148 | A | 2/1989 | Diehl-Nagle et al. | |
|---|---|---|---|---|
| 5,570,313 | A | 10/1996 | Masson et al. | |
| 5,764,995 | A * | 6/1998 | DeRoo et al. | 710/200 |
| 6,448,830 | B1 * | 9/2002 | Chuang et al. | 327/205 |
| 6,775,178 | B2 | 8/2004 | Liu et al. | |
| 7,233,518 | B2 | 6/2007 | Liu | |
| 7,352,610 | B1 | 4/2008 | Pedersen et al. | |
| 7,672,152 | B1 * | 3/2010 | Kulkarni et al. | 365/154 |
| 2002/0130348 | A1 | 9/2002 | Tran | |
| 2005/0259462 | A1 | 11/2005 | Wood | |
| 2006/0017482 | A1 * | 1/2006 | Chauhan et al. | 327/205 |
| 2006/0262612 | A1 | 11/2006 | Lovett | |
| 2007/0041242 | A1 | 2/2007 | Okazaki et al. | |
| 2008/0087927 | A1 | 4/2008 | Shin et al. | |

FOREIGN PATENT DOCUMENTS

KR     2003078128     * 10/2003

OTHER PUBLICATIONS

Aly et al., Low-Power Cache Design Using 7T SRAM Cell, IEEE Transactions of Circuits and Systems II, Express Briefs, vol. 54, No. 4, Apr. 2007, pp. 318-322.*

* cited by examiner

*Primary Examiner* — Fernando Hidalgo
(74) *Attorney, Agent, or Firm* — Treyz Law Group; David C. Kellogg; G. Victor Treyz

(57) ABSTRACT

Memory elements are provided that exhibit immunity to soft error upsets. The memory elements may have cross-coupled inverters. The inverters may be implemented using programmable Schmitt triggers. The memory elements may be locked and unlocked by providing appropriate power supply voltages to the Schmitt trigger. The memory elements may each have four inverter-like transistor pairs that form a bistable element, at least one address transistor, and at least one write enable transistor. The write enable transistor may bridge two of the four nodes. The memory elements may be locked and unlocked by turning the write enable transistor on and off. When a memory element is unlocked, the memory element is less resistant to changes in state, thereby facilitating write operations. When the memory element is locked, the memory element may exhibit enhanced immunity to soft error upsets.

23 Claims, 9 Drawing Sheets

VOLATILE MEMORY ELEMENTS WITH SOFT ERROR UPSET IMMUNITY

This application claims the benefit of provisional patent application No. 61/102,003, filed Oct. 1, 2008 and provisional patent application No. 61/113,573, filed Nov. 11, 2008, each of which is hereby incorporated by reference herein in its entirety.

BACKGROUND

This invention relates to volatile memory elements, and more particularly, to volatile memory elements that demonstrate soft error upset immunity for integrated circuits such as programmable logic devices.

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

It would therefore be desirable to be able to improve the soft error upset performance of volatile memory elements in integrated circuits such as programmable logic device integrated circuits.

SUMMARY

Integrated circuits with static random-access memory cells are provided. The integrated circuits may be programmable integrated circuits, memory chips, or any other suitable integrated circuits. The memory cells may be used as static random-access memory (SRAM) or, in programmable integrated circuits, the memory cells may be used as configuration random-access memory (CRAM). When used as CRAM cells, static output signals from the memory elements may be applied to the gates of programmable logic transistors to configure the transistors to perform desired logic functions.

Each memory cell may be formed from four transistor pairs. Each transistor pair may form an inverter-like circuit having a p-channel metal-oxide-semiconductor (PMOS) transistor connected in series with an n-channel metal-oxide-semiconductor (NMOS) transistor between a positive power supply terminal and ground. The p-channel metal-oxide-semiconductor transistor and the re-channel metal-oxide-semiconductor transistor in each transistor pair are connected at a node. The four transistor pairs may be connected in a pattern that forms a bistable memory element. Each transistor pair has gate control lines that are connected to the nodes in adjacent transistor pairs.

Data may be written into the memory cells using address transistors. There may be, for example, two or more address transistors associated with each memory cell. The address transistors may drive data into the storage nodes of the memory cell.

The memory cells are resistant to soft error upset events due to radiation strikes (e.g., due to radiation strikes from high energy particles). Even if one node in a cell is disturbed, other nodes in the memory cell remain undisturbed, allowing the memory cell to recover and thereby retain its original state.

Write enable transistors may bridge nodes in the transistor pairs. During normal operation, after a cell has been loaded with data, the write enable transistors may be turned off, allowing the cell to exhibit its normal resistance to soft error upsets. When it is desired to perform a data writing operation, the write enable transistor may be turned on. Turning on the write enable transistor shorts the bridged nodes in the bistable memory element portion of the memory cell and facilitates data writing.

Memory cells may include controllable locks. For example, the write enable transistors may serve as controllable locking circuits. As another example, a memory element may be formed from cross-coupled inverters and one or both of the cross-coupled inverters may be implemented using Schmitt trigger circuitry. The memory element may be operated in modes such as a user mode and a configuration mode. In the configuration mode, the Schmitt trigger circuitry may be configured to exhibit a relatively small amount of hysteresis, thereby unlocking the memory element and allowing data to be easily written into the memory element (e.g., allow the state of the memory element to be changed). In the user mode, the Schmitt trigger circuitry may be configured to exhibit a larger amount of hysteresis, thereby locking the memory element in its current state. When the Schmitt trigger is used to lock the memory element, the memory element may exhibit enhanced immunity to soft error upsets.

Further features of the invention, its nature and various advantages will be more apparent from the accompanying drawings and the following detailed description of the preferred embodiments.

DETAILED DESCRIPTION

The present invention relates to integrated circuit memory elements that are resistant to soft error upset events and to methods for using such memory elements. The memory elements, which are sometimes referred to as cells, may contain any suitable number of transistors. With one suitable arrangement, each cell contains ten transistors. If desired, the memory elements may have controllable locks. The controllable locks may be implemented using Schmitt trigger inverter circuitry or other suitable controllable locking circuitry.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
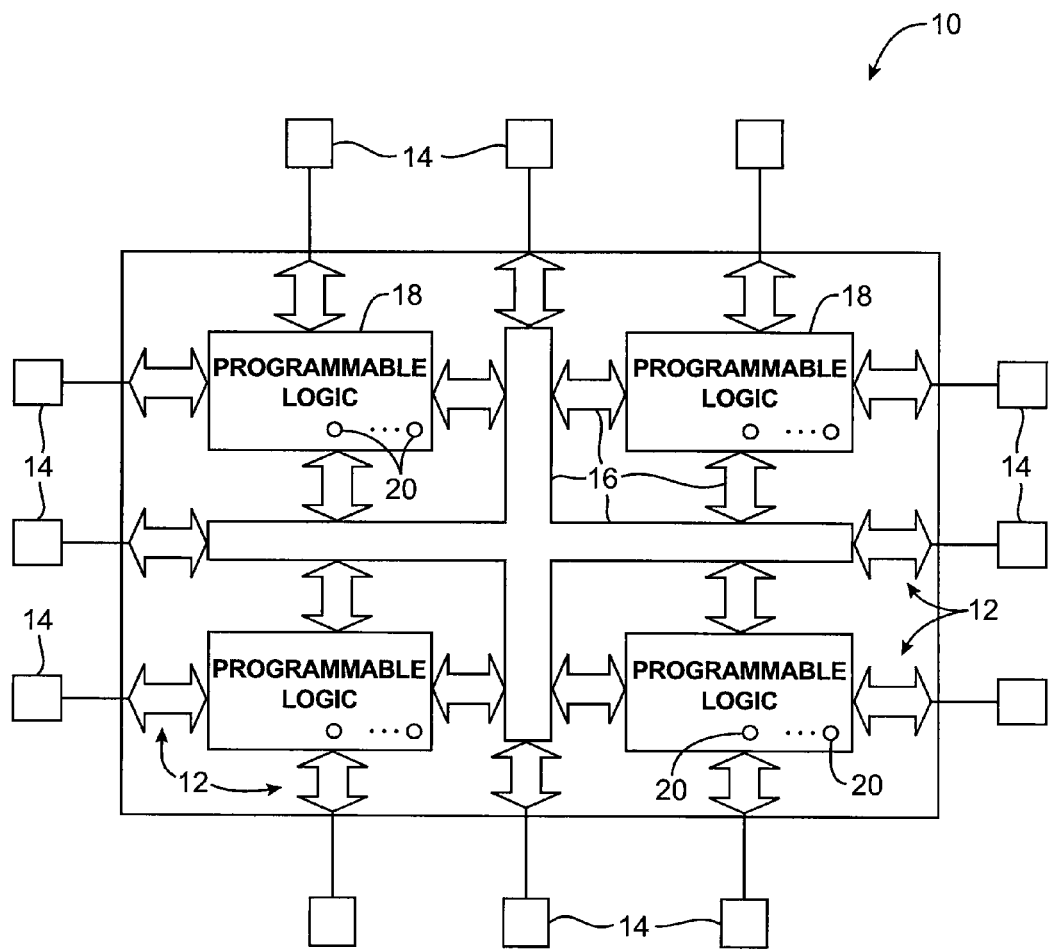
FIG. 1 is a diagram of an illustrative integrated circuit that may contain random-access memory cells in accordance with an embodiment of the present invention.

An illustrative integrated circuit such as a programmable logic device 10 in accordance with an embodiment of the present invention is shown in FIG. 1.

Device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 produce static control signals at their outputs that selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
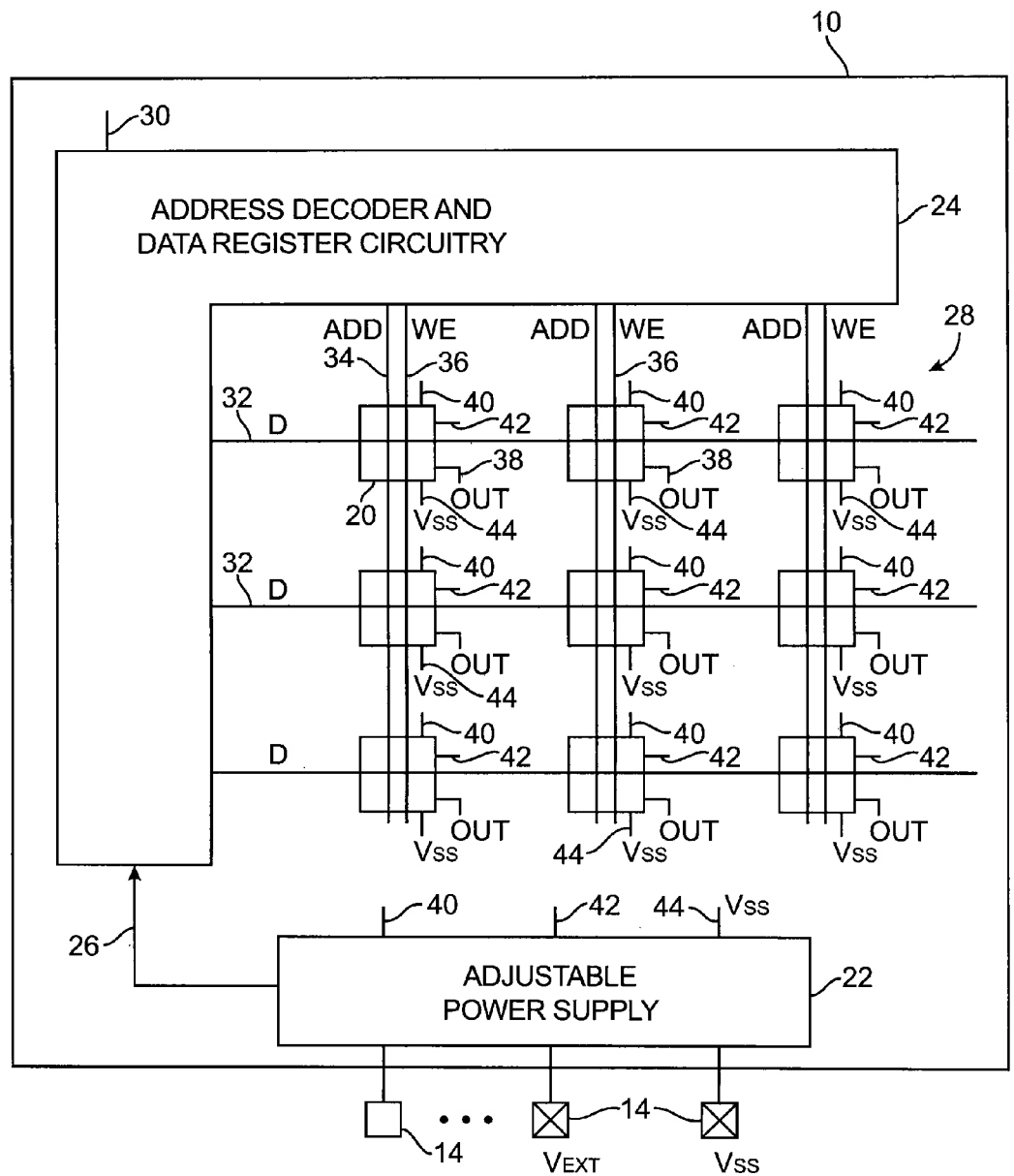
FIG. 2 is a diagram of an illustrative array of memory cells in accordance with an embodiment of the present invention.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2. As shown in FIG. 2, integrated circuit 10 may have power regulator circuitry 22. Power regulator circuitry 22 may receive external voltages via pins 14. For example, power regulator circuitry may receive one or more positive power supply voltages such as Vext and a ground voltage Vss (e.g., 0 volts). Examples of positive power supply voltages that may be received include a 0.9 volt positive power supply voltage, a 2.5 volt positive power supply voltage, etc.

Adjustable power supply circuit 22 may produce internal power supply voltages on its outputs. These power supply voltages may include one or more positive power supply voltages (e.g., a Vcc value of 0.9 volts) supplied on one or more respective power supply paths such as paths 40 and 42, ground power supply voltage Vss (e.g., 0 volts), and other suitable voltages. One or more of these voltages may be provided to address decoder and data register circuitry 24 via paths such as path 26.

Circuitry 24 may be used to read and write data from memory cell array 28. When array 28 is being used as regular SRAM, data write operations may be performed when it is desired to store processing results and data read operations may be performed when it is desired to retrieve stored data. When array 28 is being used as CRAM, data write operations may be performed to load configuration data and data read operations may be performed to confirm that configuration data loading operations have been performed successfully. During normal operation, when CRAM cells are neither being written to or read from, the static output of each CRAM cell can be used to control a respective programmable logic component such as a transistor.

Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands or rows and columns.

Lines such as lines 32, 34, 36, 38, 40, 42, and 44 may be used to distribute signals in array 28. For example, paths 40 and 42 may be used to convey positive power supply signals and path 44 may be used to convey a ground power supply signal. In an array of cells 20 that is being used as configuration memory, output signals OUT for controlling programmable logic components can be provided on output lines 38. Lines such as lines 32 may be used to load data D into cells 20 and may be used to read data out from cells 20. Write enable signal WE may be asserted on paths 36 to help prepare cells 20 for receiving data D. Address signals ADD may be asserted on various lines 34 when it is desired to address particular cells 20 for data reading or writing operations.

Power regulator circuitry 22 may generate static or time-varying power supply signals on one or more power supply outputs such as paths 40 and 42. For example, power regulator circuitry 22 may generate a fixed value of Vcc (e.g., 0.9 volts) on paths 40 and 42 or may generate a fixed value of Vcc on one path (e.g., path 42) while producing a time-varying positive power supply voltage on another path (e.g., path 40). Address decoder and data register circuitry 24 may use the power supply signals on path 26 to generate fixed signals or signals with time-varying magnitudes.

It may be advantageous to use circuitry 22 and circuitry 24 to generate fixed-magnitude signals (e.g., in configurations in which signals of fixed magnitude provide sufficient operating margin). It is generally less complex to generate fixed power supply signals and control signals with fixed magnitudes (i.e., fixed values of maximum voltage swing) than it is to generate signals that have varying magnitudes. The use of fixed-magnitude signaling schemes can therefore help to reduce device complexity and conserve circuit resources.

It may be advantageous to use more complex arrangements in which signals have time-varying magnitudes when it is desirable to help improve operating margins (e.g., without excessively increasing the sizes of memory array transistors). For example, it may be advantageous to vary the power supply voltage signals on paths 40 and/or 42 (and/or Vss) during write operations to selectively weaken certain memory cell components relative to others, thereby improving write margin. As an alternative, or in combination with such power supply schemes, other signals may be provided with "overdrive" voltage levels or otherwise adjusted levels that enhance operating margin.

As an example of an overdrive scheme that may be used with array 28, consider the situation in which the address signal ADD is selectively provided with an overdrive voltage. With this type of arrangement, the magnitude of a "logic high" address signal ADD may be varied as a function of time (e.g., from a nominal lower value of 0.9 volts to a higher "overdrive" value of 1.2 volts). Use of an elevated ADD signal during write operations may help to turn on the address transistors in the memory cells and may therefore improve write margin.

The magnitudes of data signals D (and complementary data signal ND in differential data line configurations) and the magnitudes of other signals such as write enable signal WE can likewise be changed as a function of time (e.g., overdriven or weakened) in addition to the normal time variations that these signals experience when transitioning from their logic high to logic low values. Signal magnitude variations can be imposed on both logic high signals (e.g., by temporarily reducing a logic high value from 0.9 volts to 0.7 volts or by temporarily increasing a logic high value from 0.9 volts to 1.2 volts) and logic low signals (e.g., by temporarily reducing a logic low value from 0 volts to −0.2 volts or by temporarily increasing a logic low value from 0 volts to 0.2 volts). Combinations of positive voltage variations and ground voltage variations may also be made to the signals in array 28 if desired.

Circuitry 24 may control data loading operations for array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address signals are labeled ADD in FIG. 2 and are typically controlled independently in each column.

Circuitry 24 may produce write enable signals such as signal WE on write enable lines 36. When loading data, signal WE can be asserted to improve write margin. Signal WE can be asserted in a column-wise fashion, may be asserted simultaneously for all cells 20 in array 36, or may be asserted for other suitable groups of cells.

Configuration data may be loaded into registers in circuitry 24 in series. These registers may then apply the configuration data (signals D) to array 28 over lines 32 (or over true and complementary data lines D and ND in differential data schemes). Address decoder circuitry in circuitry 24 may receive addressing information via input 30. The address decoder circuitry can then systematically assert desired address lines 34. As the address line and write enable line in each column is asserted (i.e., as the signal ADD in a given column is taken high and as the write enable line in each column or in all columns of array 28 is taken high), the data on the data lines 32 is loaded into the memory elements 20 in that column. By addressing each column in this way, the entire array 28 may be loaded with configuration data.

After the array has been loaded, the write enable signal WE may be deasserted. The output 38 of each memory element 20 may produce a corresponding static control signal OUT for controlling the gate of a pass transistor or other logic component in the programmable logic 18 of the programmable logic device 10 (FIG. 1).

Data reading operations for array 28 may be performed by systematically asserting desired address lines and monitoring the resulting data on data lines 32 (e.g., using sense amplifier circuitry in circuitry 24). The write enable signal WE may be deasserted (i.e., held low) during read operations.

Figure 3:
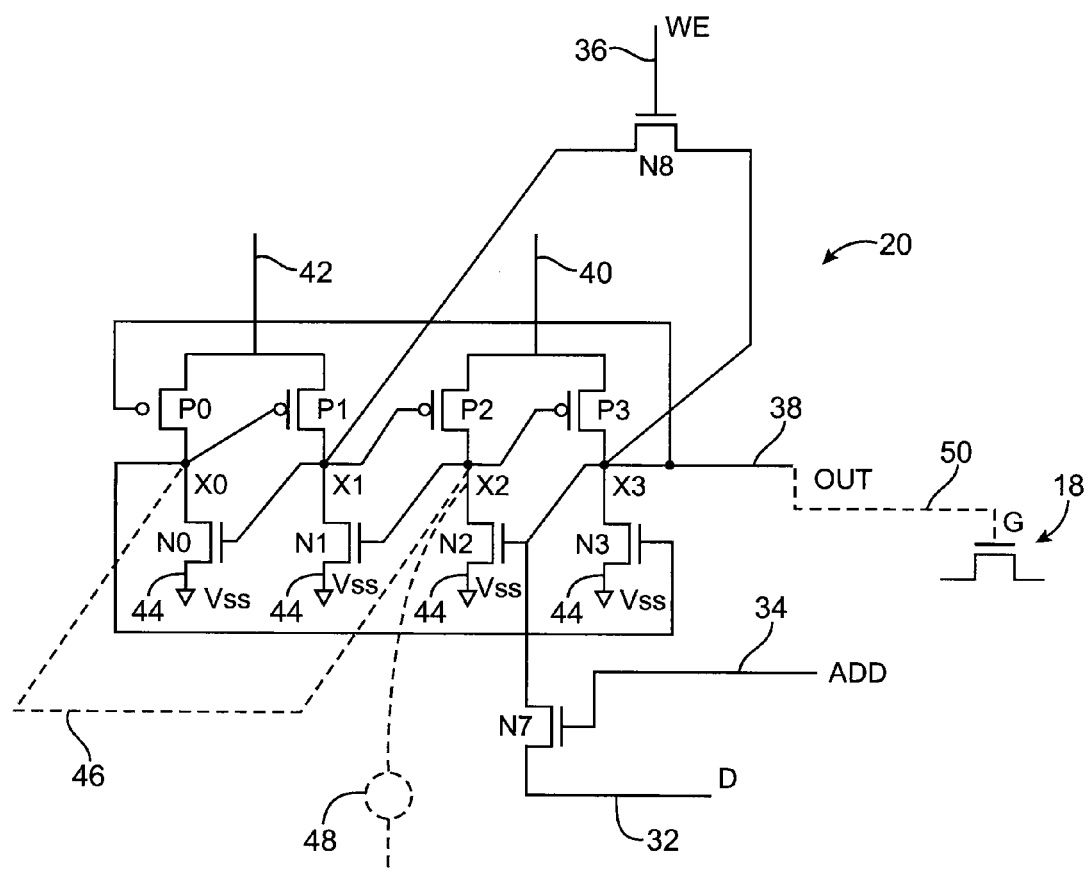
FIG. 3 is a diagram of an illustrative memory cell in accordance with an embodiment of the present invention.

A memory element 20 of the type that may be used in array 28 of FIG. 2 is shown in FIG. 3. As shown in FIG. 3, memory element 20 may have p-channel metal-oxide-semiconductor (PMOS) transistors P0, P1, P2, and P3 and re-channel metal-oxide-semiconductor (NMOS) transistors N0, N1, N2, N3, N6, and N7. Each transistor in memory element 20 may have a source S, a drain D, a body B, and a gate G. The sources and drains of the transistors are sometimes collectively referred to as source-drain terminals.

Data can be conveyed over true and complement data lines or, as shown in the illustrative configuration of FIG. 3, data D can be conveyed to cell 20 over data line 32.

Address signal ADD may be provided to the gate of address transistor N7 via address line 34. The value of address signal ADD can be used to control address transistor N7. Transistor N7 may be turned off during normal operation by taking signal ADD low. In this situation, output signal OUT on line 38 may be used as a static control signal to control programmable logic (e.g., by being applied to the gate G of a programmable logic metal-oxide-semiconductor transistor 18 by path 50 as shown in FIG. 3).

Write enable signal WE may be provided to the gate of write enable transistor N8 via line 36. Write enable transistor N8 may sometimes be referred to herein as locking circuitry. When it is desired to write data into cell 20, write enable signal WE may be asserted (e.g., taken high in configurations in which transistor N8 is an n-channel metal-oxide-semiconductor transistor as shown in the example of FIG. 3 or taken low in configurations in which transistor N8 is a p-channel metal-oxide-semiconductor transistor). The asserted WE signal turns on transistor N8. When transistor N8 is on, data may be loaded into cell 20 with greater write margin than when transistor N8 is off. The selective enabling of transistor N8 during data loading operations therefore helps to ensure that cell 20 operates properly.

Unlike conventional memory element designs that are based on a pair of cross-coupled inverters, memory element 20 of FIG. 3 has four inverter-like pairs of transistors that are connected in a ring (first pair P0/N0, second pair P1/N1, third pair P2/N2, and fourth pair P3/N3). In conventional cross-coupled inverter designs, there is a relatively strong likelihood that a radiation strike on an inverter's input node will cause the inverter's output to change states, thereby flipping the state of the cell to an erroneous value. In the arrangement of FIG. 3, the gate of the p-channel transistor in each transistor pair receives its input from a different source than the gate of the re-channel transistor in the same transistor pair. Because the control signals for the gates of the transistors are distributed in this way, memory cell 20 is better able to recover from a radiation strike on a particular node without flipping its state than conventional memory elements based on cross-coupled inverters.

There are four labeled nodes in memory element 20 of FIG. 3: X0, X1, X2, and X3. Any of these nodes may be used as output 38 of FIG. 2. For example, node X3 may be connected to output 38 of FIG. 2 as shown in FIG. 3.

Memory element 20 exhibits bistable operation. When memory element 20 has been loaded with a "0," the values of X0, X1, X2, and X3 will be "1," "0,", "1," and "0," respectively. When memory element has been loaded with a "1," the values of X0, X1, X2, and X3 will be "0," "1,", "0," and "1," respectively.

During normal operation as CRAM memory, each cell 20 in array 28 may be used to provide a corresponding output signal OUT at its output line 38. The OUT signals may serve as static control signals that control programmable logic 18. In this mode of operation, the address signal ADD in each cell 20 is deasserted (e.g., ADD is low), so that address transistor N7 in each cell 20 is off. With address transistor N7 off, data signal line 32 will be isolated from the latch transistors in cell 20 (i.e., transistors P0, N0, P1, N1, P2, N2, P3, and N3). Write enable signal WE is also deasserted during normal operation (e.g., write enable signal WE is held low in cell configurations in which N8 is an NMOS transistor), turning off write enable transistor N8. Deasserting write enable signal WE during normal operations (e.g., when memory cell 20 is locked) may sometimes be referred to herein as asserting a lock control signal (e.g., asserting a lock control signal on transistor N8, thereby turning transistor N8 off).

With transistors N7 and N8 off, cell 20 holds its loaded data value and exhibits good immunity to radiation-induced upset events.

Consider, as an example, the situation in which node X0 and node X2 are low ("0") and node X1 and node X3 are high ("1"). If radiation strikes node X0, radiation-induced charge on node X0 may cause the voltage on node X0 to go high (e.g., to positive power supply voltage Vcc or even higher). When the voltage on node X0 goes high, transistor N3 in transistor pair P3/N3 turns on. The voltage on node X2 is low, so transistor P3 is already on. With both transistor N3 and P3 on, the voltage on node X3 falls to about Vcc/2 (i.e., midway between the positive power supply voltage of Vcc applied to terminal 40 and a ground voltage Vss of 0 volts on ground terminal 44).

The high X0 voltage that was produced by the radiation strike is routed to the gate of p-channel metal-oxide-semiconductor transistor P1. This turns off transistor P1. N-channel metal-oxide-semiconductor transistor N1 has a gate controlled by the signal on node X2. Because node X2 is low, transistor N1 is off. When transistor P1 is turned off while transistor N1 is off, node X1 is no longer directly connected to either positive power supply voltage Vcc on positive power supply line 42 or ground voltage Vss on ground power supply line 44. Node X1 therefore floats, retaining its original high state, despite the radiation strike.

The unperturbed signal on node X1 serves as a control signal that is applied to the gate of transistor P2. Before the radiation strike, node X1 was high and transistor P2 was off. After the radiation strike, node X1 retains its original high state, so the state of transistor P2 is unchanged. Transistor N2 is controlled by a reduced high voltage (Vcc/2), but is able to hold node X2 low, because transistor P2 remains off. As with the unperturbed signal on node X1, the voltage on node X2 is therefore unperturbed by the radiation strike.

Because the voltage on node X2 remains low, transistor P3 remains on and pulls node X3 high. Even though node X3 is momentarily reduced in voltage from Vcc to Vcc/2, the node X3 signal is still able to hold transistor P0 at least partially off, so that transistor N0, which is held on by unperturbed high signal on node X1, is able to pull node X0 low. Eventually, the radiation-induced charge on node X0 that momentarily elevated the voltage on node X0 will dissipate and node X0 will return to its normal (pre-strike) state of 0 volts. Once X0 reaches 0 volts, transistor N3 turns off and node X3 regains its pre-strike voltage of Vcc.

As this example demonstrates, the architecture of cell 20 allows the cell to retain its stored data value (a stored "1" in this example), even when a node in the cell is struck by radiation.

The contents of cell 20 may be read by address decoder and data register circuitry 24 by taking address signal ADD high, while leaving write enable signal WE low. When array 28 is used as an SRAM array, read operations may be performed to retrieve data for processing. When array 28 is used as a CRAM array, read operations may be performed to confirm that configuration data has been properly loaded into array 28.

The immunity of cell 20 to undesired changes in state from radiation strikes helps to ensure that array 28 will exhibit stable operation in a variety of circumstances. However, this stability can make it challenging to write data into cell 20.

The resistance of cell 20 to changes in state can be weakened by asserting write enable signal WE to turn on transistor N8. When transistor N8 is turned on, nodes X3 and X1 are shorted together. As a result, the susceptibility of cell 20 to cell disturbances is increased, facilitating write operations using transistor N7.

Consider, as an example, a write operation in which cell 20 is storing a zero and in which data line D is taken high in an effort to drive node X3 and output signal OUT to a logic one level. When write enable WE was low and transistor N8 was off, the Vcc/2 signal that was produced on node X3 from the radiation strike on node X0 was eventually overpowered by the unperturbed high X1 value. When write enable WE is high and transistor N8 is on, nodes X1 and X3 are shorted, so that the increase in voltage on node X3 that arises when driving a high data signal D from line 32 into cell 20 through transistor N7 is coupled to both node X3 and node X1 in parallel. In this situation, node X1 is no longer isolated and protected from the change in voltage taking place on node X3. As a result, X1 can be pulled high in concert with node X3, turning off both transistor P0 and transistor P2 and turning on both transistor N0 and transistor N2. With transistor P0 off and transistor N0 on, node X0 is pulled low. With transistor P2 off and transistor N2 on, node X2 is pulled low. When X0 and X2 are driven low in this way, the state of cell 20 flips, so that cell 20 settles into a state in which nodes X0 and X2 are low and nodes X1 and X3 are high. This completes the data "1" loading operation successfully. Write enable line WE may then be deasserted on line 36 to turn off transistor N8 and return cell 20 to its stable radiation-immune state.

If desired, the strengths of the signals in cell 20 can be varied in conjunction with the write enable signal. For example, transistor pairs P0/N0 and P1/N1 can be momentarily weakened by lowering the power supply voltage on terminal 42 during write operations relative to the power supply voltage on terminal 40. Write operations may also be facilitated by using an overdrive signal for data signal D and/or address signal 34.

It is not necessary for write enable transistor N8 to be connected between nodes X1 and X3. For example, transistors N8 may be connected between nodes X0 and X2. If desired, a p-channel metal-oxide-semiconductor (PMOS) transistor may be used in place of the illustrative n-channel metal-oxide-semiconductor (NMOS) transistor N8 of FIG. 3. More than one write enable transistor may also be used. For example, a first write enable transistor may be used to bridge nodes X0 and X2 as indicated by dashed line 46 and a second write enable transistor may be used to bridge nodes X1 and X3. NMOS or PMOS transistors or both NMOS and PMOS transistors may be used in bridging the appropriate nodes in cell 20.

The illustrative data loading scheme of FIG. 3 involves driving data signal D through a single address transistor 32 onto node X3. This is merely illustrative. For example, complementary data signal ND may be loaded into cell 20 instead of data signal D. Data signal D or complementary data signal ND may be driven onto any of the nodes in cell 20 (X0, X1, X2, or X3). Differential data loading schemes may also be used. For example, a first address transistor such as transistor N7 may be used to drive true data signal D onto node X3 while a second address transistor 48 may be used to drive complementary data signal ND onto node X2. Data loading schemes based on three address transistors or four address transistors may also be used. An advantage of ten transistor (10T) cell configurations of the type shown in FIG. 3 is that this type of configuration may be less complex and may consume less integrated circuit area than configurations that use more than ten transistors per cell.

Figure 4:
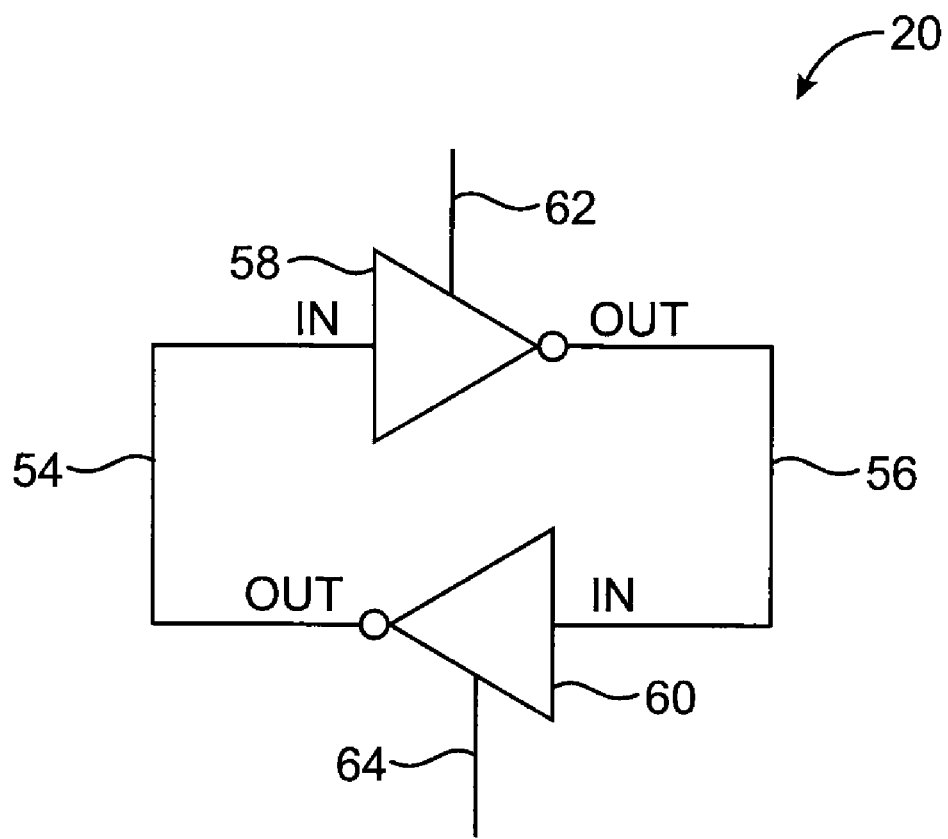
FIG. 4 is a diagram of an illustrative memory element that may have controllable inverter circuitry such as programmable Schmitt trigger circuitry to serve as controllable locks in accordance with an embodiment of the present invention.

If desired, memory elements such as memory element 20 in device 10 may include controllable locks (locking circuitry) implemented using Schmitt trigger inverter circuitry. A memory element 20 that may have controllable locks is shown in FIG. 4. The cell 20 of FIG. 4 contains two cross-coupled inverters 58 and 60. The output of inverter 58 is connected over line 56 to the input of inverter 60 while the output of inverter 60 is connected over line 54 to the input of inverter 58. With one suitable arrangement, lines 54 and 56 may be a data out line and an inverted data out line, respectively.

Inverter 58 and/or inverter 60 may be implemented using an inverting Schmitt trigger circuit. Typically, an inverter in a memory element switches from a first state to a second state (e.g., switches from inverting a "0" to a "1" or inverting a "1" to a "0") as the input signal for the inverter crosses a given voltage between the states (e.g., a voltage that is approximately the average of the "0" voltage and the "1" voltage) regardless of which state inverter is in. In contrast, a Schmitt-trigger-based inverter such as inverter 58 or inverter 60 exhibits hysteresis in switching between states. The Schmitt-trigger-based inverter may therefore switch from its first state to its second state as its input passes a first voltage and from its second state to its first state as its input passes a second voltage. For example, suppose that in its first state the Schmitt-trigger based inverter receives a 0 volt input and outputs a 1 volt output. The Schmitt-trigger may not switch to its second state (in which it outputs a 0 volt output) until the input voltage has risen above 0.8 volts as opposed to a typical inverter which may switch states at 0.5 volts. There is therefore a delay in switching the inverter output from high to low as the input to the Schmitt trigger inverter rises. There is also a delay in switching the inverter output from low to high as the input to the Schmitt trigger inverter falls. These disparities in the trip points for the inverter give rise to hysteresis.

If desired, one or both of inverters 58 and 60 may be implemented using a programmable Schmitt trigger. For example, inverters 58 and 60 may be programmable Schmitt triggers that receive control signals over control paths 62 and 64, respectively. With this type of arrangement, control paths 62 and 64 may be used to adjust the magnitude of the hysteresis of the programmable Schmitt trigger inverters (e.g., adjust the separation between the aforementioned first and second voltages).

In a typical CRAM arrangement, the control signals are used to place the Schmitt trigger circuitry in a first (easily flipped) state (with low hysteresis) during data loading operations, so that configuration data can be easily loaded. During normal user mode operations, the control signals may be used to place the Schmitt trigger circuitry in a second (locked) state (with high hysteresis) in which it is difficult to flip the state of the Schmitt trigger. In this locked state, the memory element is less susceptible to undesired soft error upset events.

Figure 5:
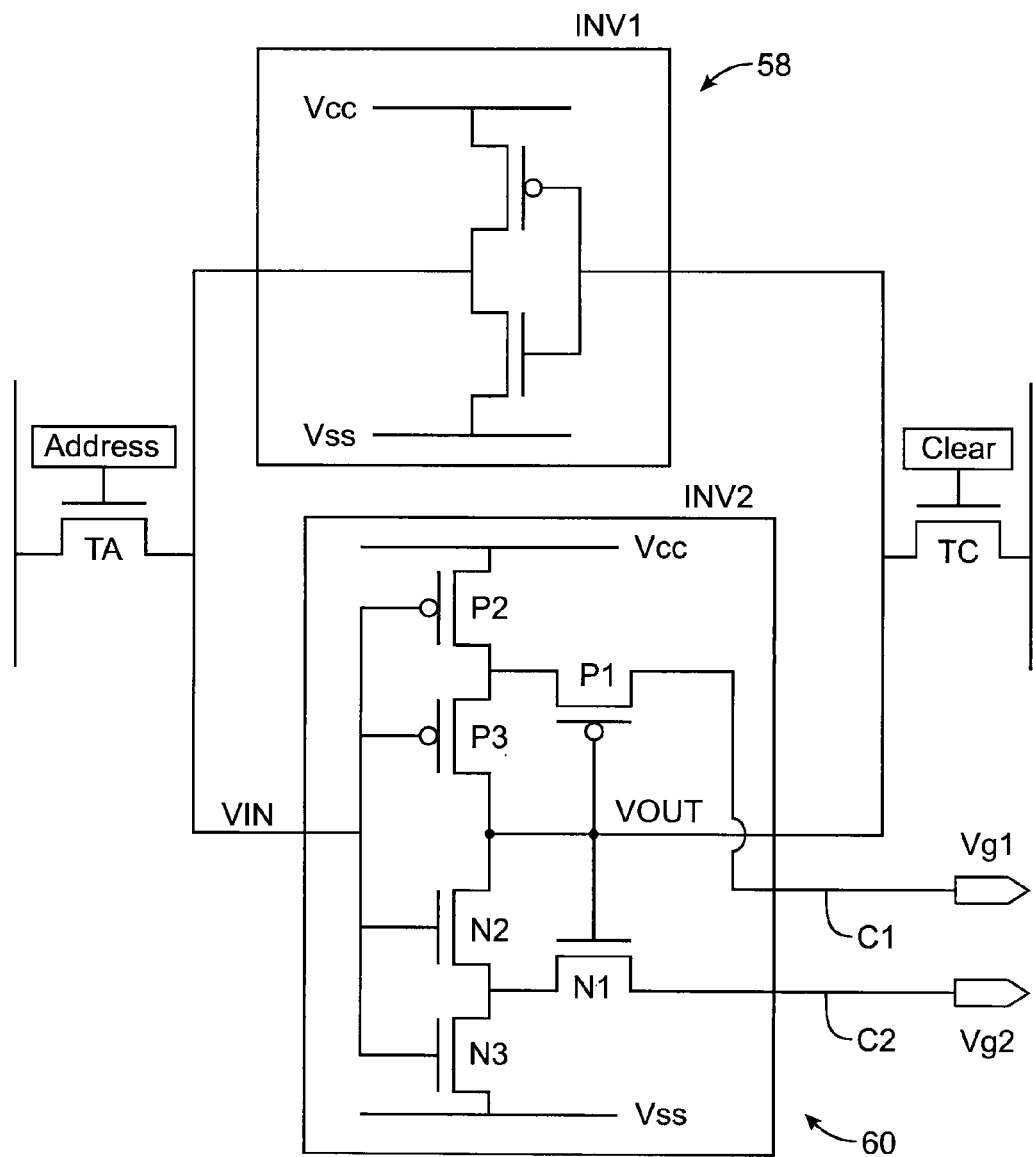
FIG. 5 is a diagram of an illustrative memory element that may have controllable inverter circuitry in accordance with an embodiment of the present invention.

An illustrative memory element 20 in which one of its cross-coupled inverters has been implemented using a controllable Schmitt trigger is shown in FIG. 5. As shown in FIG. 5, memory element 20 has clear transistor TC, address transistor TA, and cross-coupled inverters INV1 and INV2 (e.g., inverters 58 and 60). Inverter INV2 is based on a Schmitt trigger design and can be controlled using control lines such as control line C1 and control line C2.

When it is desired to load configuration data or other data into element 20, the Schmitt trigger functionality of inverter INV2 can be disabled. When it is desired to operate memory element 20 normally (i.e., in user mode on a programmable logic device), the Schmitt trigger functionality of inverter INV2 can be enabled. When the Schmitt trigger functionality is enabled, the sensitivity of inverter INV2 to voltage changes on its input is reduced relative to that of a regular inverter. Consider, for example, a scenario in which Vcc of FIG. 5 is 1.5 volts. Inverter INV1 can be configured to have a nominal trip point voltage of 0.75 volts. If the input to inverter INV1 is less than 0.75 volts, its output will be high, otherwise its output will be low. When inverter INV2 is operated in non-Schmitt-trigger mode, inverter INV2 may operate in the same way. However, when inverter INV2 is switched into Schmitt trigger mode, a larger positive input voltage (e.g., 1.0 volts) will be required on the input of INV2 before the output of the Schmitt trigger will flip from high to low and a lower input voltage (e.g., 0.5 volts) will be required in order to flip the output of the Schmitt trigger from low to high. The hysteresis provided by placing INV2 into Schmitt trigger mode therefore serves to lock the memory element 20 into its loaded state. Once locked in this way, memory element 20 becomes relatively more immune to disruption by soft error upset events, because larger voltage fluctuations would be required to flip the state of the memory element.

Any suitable control signals may be used to control the state of inverter INV2. With one suitable arrangement, a controllable power supply or other suitable control circuit may allow voltage Vg1 and Vg2 to float or may place voltage Vg1 and Vg2 at Vcc/2 when it is desired to disable the Schmitt trigger operation of inverter INV2. When control lines C1 and C2 are powered in this way, transistors P1 and N1 are disabled and do not participate in the operation of INV2. With P1 and N1 inactive, transistors P2 and P3 operate in parallel to form a single larger p-channel metal-oxide-semiconductor (PMOS) transistor. Similarly, transistors N2 and N3 operate in parallel as a single larger n-channel metal-oxide-semiconductor (NMOS) transistor. When a high input voltage is supplied to the input of inverter INV2 in its non-Schmitt-trigger mode, transistors P2 and P3 will be turned off and transistors N2 and N3 will be turned on, pulling the output of INV2 low. When a low input voltage is supplied to the input of inverter INV2 in its non-Schmitt-trigger mode, transistors P2 and P3 will be turned on and transistors N2 and N3 will be turned off, pulling the output of INV2 high. Transistors P2, P3, N2, and N3 therefore form an inverter.

When it is desired to activate the Schmitt trigger functionality of inverter INV2, Vg1 may be taken to a low voltage (e.g., a voltage of Vss or other suitable low voltage) and Vg2 may be taken to a high voltage (e.g., a voltage of Vcc or other suitable elevated voltage). In this situation, the transistors P1 and N1 are activated and form part of the circuitry in inverter INV2. Inverter INV2 functions as a Schmitt trigger having threshold voltages (trigger points) that are controlled by the magnitudes of Vg1 and Vg2. If it is desired to lock memory element 20 with a high hysteresis setting (relatively high soft error upset immunity), Vg2 may be provided at a voltage greater than Vcc (e.g., 1.8 volts if Vcc if 1.5 volts) and Vg1 may be provided at a voltage less than Vss (e.g., −0.5 volts if Vss is 0 volts). If a more moderate hysteresis level is acceptable, Vg2 may be set to Vcc (e.g., 1.5 volts) and Vg1 may be set to Vss (e.g., 0 volts).

As shown in FIG. 5, inverter 60 (i.e., programmable Schmitt trigger circuitry 60) may receive input signals on input line VIN and may generate output signals on output line VOUT.

The magnitude of the hysteresis of the programmable Schmitt trigger circuits 58 and 60 may determine whether memory element 20 is "locked" or is "unlocked." The magnitude of the hysteresis of circuits 58 and 60 may be varied by varying the voltages Vg1 and Vg2. For example, when the voltages Vg1 and Vg2 are approximately equal to Vcc/2, the hysteresis of circuits 58 and 60 may be relatively low. As the voltage Vg2 increases and the voltage Vg1 decreases, the hysteresis of circuits 58 and 60 may increase. By varying the magnitude of the hysteresis of circuits 58 and/or 60, the resistance of memory element 20 to changes in state can be controlled.

When it is desired to write data in memory element 20, memory element 20 may be unlocked by reducing the hysteresis of the programmable Schmitt trigger circuits. As one example, the hysteresis of the Schmitt trigger circuits may be eliminated when the memory element 20 is unlocked. This example is illustrated in the graph of FIG. 6.

Figure 6:
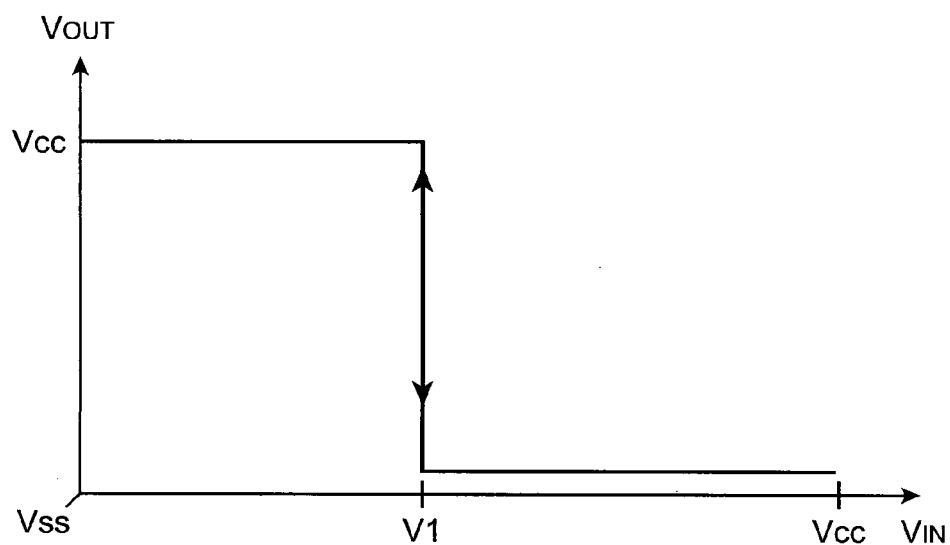
FIG. 6 is a graph showing illustrative input signals and output signals for a memory cell with programmable Schmitt trigger circuitry that is in an unlocked (low hysteresis) state in accordance with an embodiment of the present invention.

As shown in FIG. 6, when memory element 20 is unlocked (e.g., Vg1 and Vg2 are at approximately Vcc/2), inverter 60 may not exhibit hysteresis, or may exhibit a relatively small amount of hysteresis, in switching between states. For example, when the output of inverter 60 and memory element 20 is initially high, the output of inverter 60 may go low as the voltage on input line VIN rises above a threshold voltage V1 (e.g., as data signals are driven onto line VIN through address transistor TA). Similarly, when the output of inverter 60 is initially low, the output of inverter 60 may go high as the voltage on input line VIN drops below the threshold voltage V1.

Figure 7:
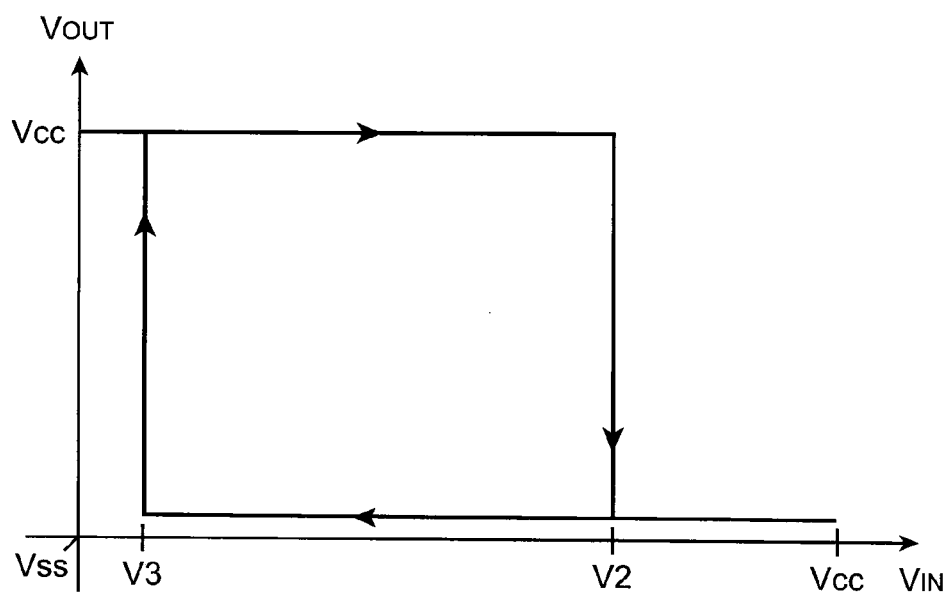
FIG. 7 is a graph showing illustrative input signals and output signals for a memory cell with programmable Schmitt trigger circuitry that is in a locked (high hysteresis) state in accordance with an embodiment of the present invention.

In contrast, when memory element 20 is locked (e.g., Vg1 and Vg2 are at approximately Vss and Vcc, respectively), inverter 60 may exhibit a relatively large hysteresis in switching between states, thereby increasing the resistance of memory element 20 to changes in state. For example, as illustrated in the graph of FIG. 7, when the output of inverter 60 is initially high, the output of inverter 60 may not go low until the voltage on input VIN rises above a threshold voltage V2. Similarly, when the output of inverter 60 is initially low, the output of inverter 60 may not go high until the voltage on input VIN drops below a threshold voltage V3. Because of the difference between the threshold voltages V2 and V3, memory element 20 is relatively resistant to changes in states.

Figure 8:
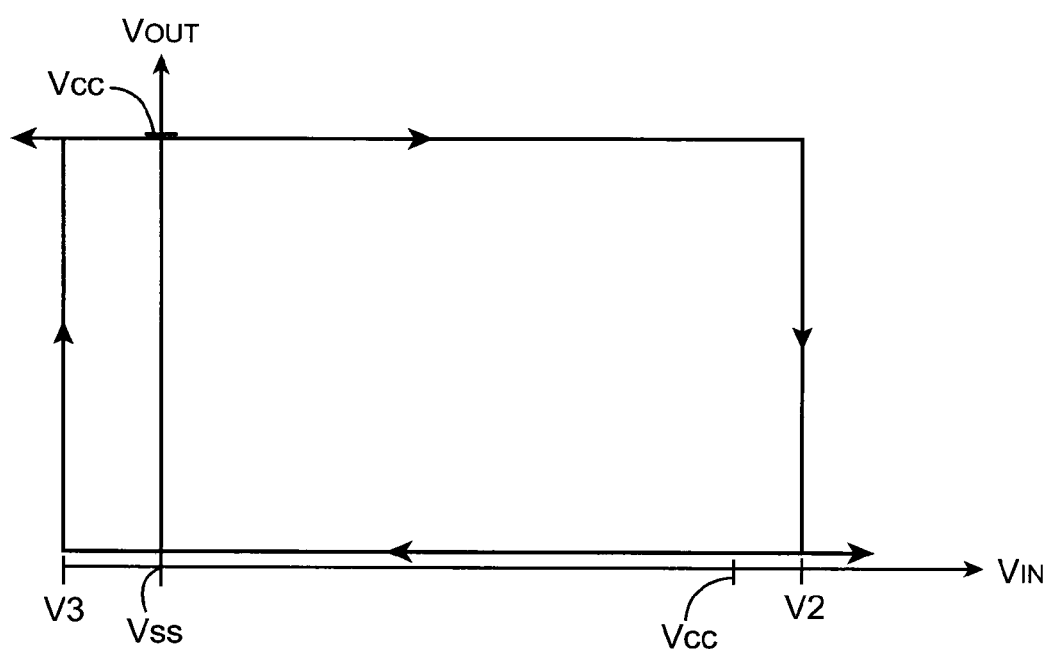
FIG. 8 is a graph showing illustrative input signals and output signals for a memory cell with programmable Schmitt trigger circuitry that is in a locked state in which the voltages needed to flip the state of the memory cell extend beyond the nominal levels used for memory cell power supply signals in accordance with an embodiment of the present invention.

If desired, the hysteresis of inverter 60 may be large enough when memory element 20 is locked that the voltage needed to flip the state of memory element 20 is beyond the voltages that are normally produced for element 20 by available power supply sources. For example, as illustrated in FIG. 8, the threshold voltage V2 may be higher than the nominal positive power supply voltage Vcc and the threshold voltage V2 may be lower than the nominal ground power supply voltage Vss. With this type of arrangement, even when a data signal at a full nominal power supply voltage is driven onto the input line VIN (e.g., using one or more address transistors such as transistor TA), the state of the locked memory element 20 will not change. This type of arrangement may be implemented by driving the voltage Vg1 to be lower than Vss, driving the voltage Vg2 to be greater than Vcc, by altering the relative strengths of the transistors in circuits 58 and 60, and by combinations of these and other techniques.

The hysteresis of a programmable Schmitt trigger inverter such as inverter 60 may be varied by altering the relative strengths of the transistors that make up the inverter. For example, when memory element 20 is locked (e.g., Vg1 and Vg2 are approximately Vss and Vcc, respectively), the hysteresis of inverter 60 will increase as the strength of transistors N1 and P1 increases and/or the strength of transistors N3 and P3 decreases.

As shown in the examples of FIGS. 3, 4, and 5, memory element 20 may operate in a locked mode and an unlocked mode. The memory element 20 may be placed in the locked mode during normal operations (e.g., when data is not being loaded into element 20) and may be placed in the unlocked mode to load data into the memory element 20. Memory element 20 may receive control signals such as one or more lock signals that lock and unlock the memory element 20. The lock signals may be generated by control circuitry such as the address decoder and data register circuitry 24 of FIG. 2.

Figure 9:
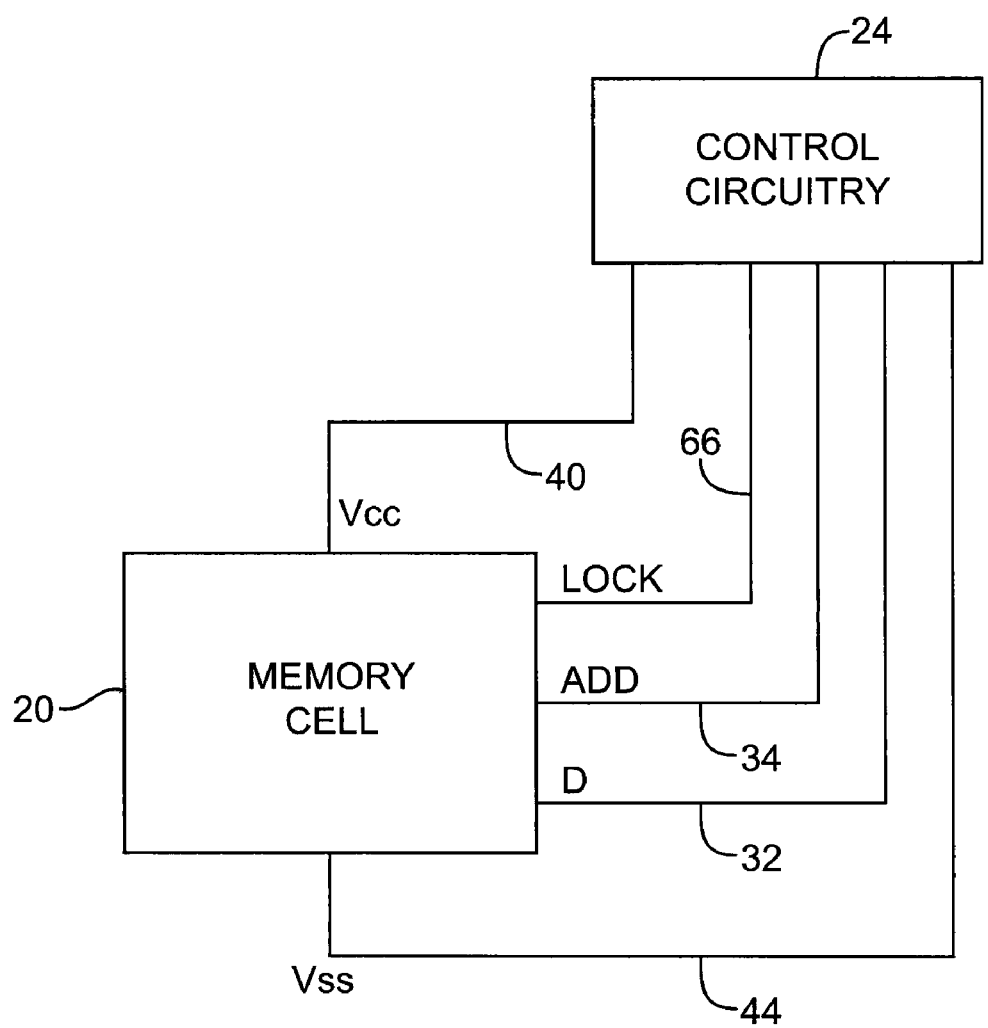
FIG. 9 is a diagram of a illustrative control circuitry and a memory cell that may receive lock and unlock signals from the control circuitry that adjust the resistance of the memory cell to changes in state in accordance with an embodiment of the present invention.

A schematic diagram of control circuitry that may generate lock signals for a memory cell is shown in FIG. 9. As shown in FIG. 9, control circuitry 24 (e.g., address decoder and data register circuitry 24) may generate lock and unlock control signals on lock control path 66 (i.e., one or more lock control lines 66). Paths 66 may include global path connected to all the memory element 20 in an array 28, row (or column) paths connected to rows (or columns) of memory elements 20 in array 28, and paths connected to individual memory elements 20 in array 28 (as examples). Path 66 may include one or more lines, as desired. As examples, the lock signals may include write enable signal WE (i.e., from the examples of FIGS. 2 and 3), control signals carried on control paths 62 and 64 (i.e., from the example of FIG. 4), and voltages Vg1 and Vg2 (i.e., from the example of FIG. 5). The control lines C1 and C2 that carry voltages Vg1 and Vg2 in the FIG. 5 may be a part of lock control path 66, control lines 62 and 64 of FIG. 4 may be part of lock control path 66, and write enable line 36 of FIG. 3 may be part of lock control path 66 (as examples). The control circuitry may provide memory element 20 with positive power supply signals over path 40, address signals over path 34, data signals over path 32, and ground power supply signals over path 44.

Figure 10:
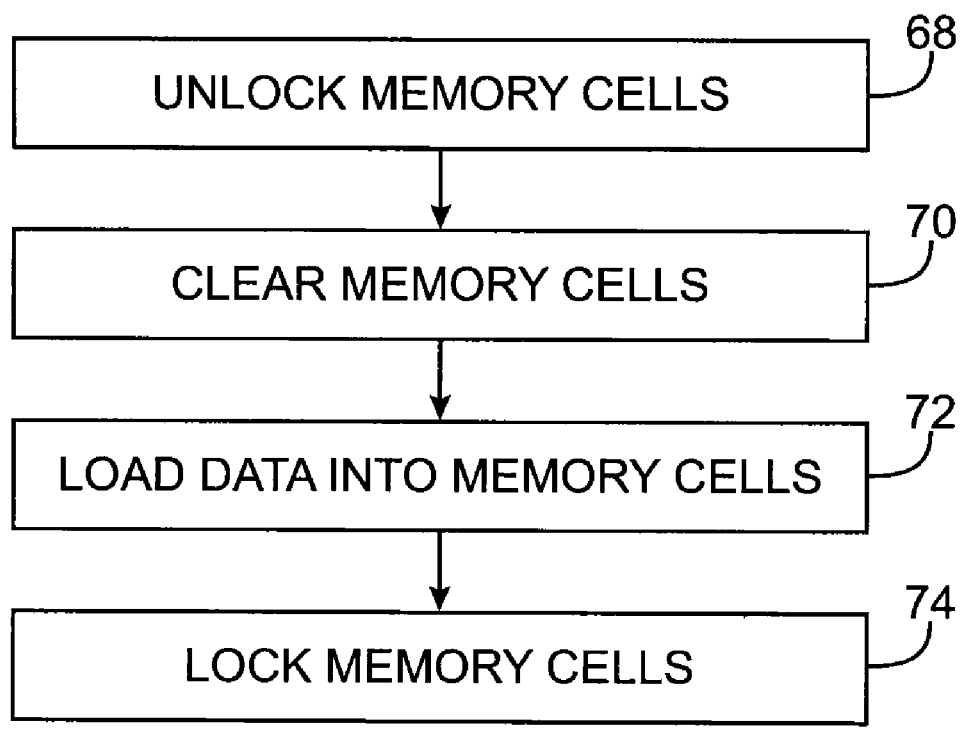
FIG. 10 is a flow chart of illustrative steps involved in loading data into a memory cell that can be locked and unlocked to adjust the resistance of the memory cell to changes in state in accordance with an embodiment of the present invention.

A flow chart of illustrative steps involved in using a memory element 20 that can be locked and unlocked is shown in FIG. 10. As examples, the memory element 20 may be locked and unlocked using a write enable transistor N8 such as in the FIG. 3 example or using programmable Schmitt trigger inverters 58 and 60 as in the examples of FIGS. 4 and 5.

In step 68, memory element 20 may be unlocked, thereby enabling data to be written into the memory element 20. As one example, a write enable signal may be generated by control circuitry 24 and asserted on line 36 to turn on write enable transistor N8, thereby shorting together nodes X1 and X3. As another example, control circuitry 24 may assert signals on control lines C1 and C2 to reduce the hysteresis of the programmable Schmitt trigger inverters 58 and 60 (e.g., by generating appropriate Vg1 and Vg2 signals).

After memory element 20 has been unlocked, optional step 70 may be performed. In optional step 70, the memory element 20 (i.e., memory cell 20) may be cleared of data. As one example, clear signals may be asserted by control circuitry 24 to turn on clear transistor TC of FIG. 5 and couple the input of inverter INV1 to a clear line.

In step 72, data may be written into memory element 20. For example, address signals on line 34 may be asserted by control circuitry 24 to turn on address transistor TA of FIG. 5 so that data on line 32 may be driven by transistor TA onto input line VIN (i.e., the input to inverter INV2). As another example, address signals on line 34 may be asserted by control circuitry 24 to turn on address transistor N7 of FIG. 3 so that data D on line 32 may be driven by transistor N7 onto node X3. In a typical arrangement, an entire array of memory cells may be loaded with desired data in this way.

After data has been loaded into the memory element 20 in step 72 (e.g., into all of such memory elements in an array), the memory element 20 may be locked in step 74, thereby increasing the resistance of the memory element 20 to state changes and increasing the memory element's resistance to soft error upsets. As one example, the write enable signal generated by control circuitry 24 to unlock element 20 may be deasserted to turn off write enable transistor N8. As another example, control circuitry 24 may assert signals on control lines C1 and C2 to increase the hysteresis of the programmable Schmitt trigger inverters 58 and 60 (e.g., by generating appropriate Vg1 and Vg2 signals). Following step 72, the memory element 20 may be used in normal operations. For example, in an array of memory elements 20 that is being used as configuration memory, each memory element 20 may provide output signals OUT on a corresponding output line 38 for controlling a respective programmable logic component such as a pass transistor 18 (see, e.g., FIG. 3).

If desired, the arrangements of FIGS. 3, 4, and 5 may be combined. For example, memory element 20 may include four (or more) interconnected inverter-type circuits that form a bistable memory cell having a node for each transistor pair and at least one write enable transistor that shorts together two nodes in the bistable memory cell. One or more of the inverter-type circuits may be a programmable Schmitt trigger (as in the examples of FIGS. 4 and 5) and the remaining inverter-type circuits may be transistor pairs (as in the example of FIG. 3).

The foregoing is merely illustrative of the principles of this invention and various modifications can be made by those skilled in the art without departing from the scope and spirit of the invention.

What is claimed is:

1. Memory circuitry, comprising:
   a bistable memory cell that stores data; and
   a lock control path that receives lock control signals that selectively lock the bistable memory cell to prevent changes to the stored data, wherein the bistable memory cell comprises circuitry that receives the lock control signals to place the bistable memory cell in a locked mode in which the bistable memory cell has a first resistance to soft error upset events and an unlocked mode in which the bistable memory cell has a second resistance to soft error upset events and wherein the first resistance is greater than the second resistance.

2. The memory circuitry defined in claim 1 further comprising at least one address transistor that receives an address signal that is asserted to load the data into the bistable memory cell.

3. The memory circuitry defined in claim 2 wherein the bistable memory cell comprises programmable Schmitt trigger circuitry that receives the lock control signals.

4. The memory circuitry defined in claim 2 wherein the bistable memory cell has at least three internal data storage nodes.

5. The memory circuitry defined in claim 4 further comprising a write enable transistor that selectively connects two of the internal data storage nodes together in response to the lock control signals.

6. The memory circuitry defined in claim 5 further comprising multiple pairs of p-channel and n-channel metal-oxide-semiconductor transistors, wherein each of the internal data storage nodes is connected between one of the p-channel metal-oxide-semiconductor transistors and one of the re-channel metal-oxide-semiconductor transistors.

7. Memory circuitry, comprising:
a bistable memory cell that stores data; and
a lock control path that receives lock control signals that selectively lock the memory circuitry to prevent changes to the data;
at least one address transistor that receives an address signal that is asserted to load the data into the bistable memory cell;
four transistor pairs that are interconnected to form the bistable memory cell, wherein the bistable memory cell has four nodes, each node being connected between an n-channel transistor and a p-channel transistor in a respective one of the transistor pairs; and
at least one write enable transistor that receives the lock control signals and that selectively bridges two of the nodes in response to the lock control signals.

8. Memory circuitry, comprising:
a bistable memory cell that stores data; and
a lock control path that receives lock control signals that selectively lock the memory circuitry to prevent changes to the data;
at least one address transistor that receives an address signal that is asserted to load the data into the bistable memory cell;
four transistor pairs that are interconnected to form the bistable memory cell, wherein the bistable memory cell has first, second, third, and fourth nodes, each node being connected between an n-channel transistor and a p-channel transistor in a respective one of the transistor pairs;
a first write enable transistor that receives the lock control signals and that selectively connects the first and second nodes together in response to the lock control signals; and
a second write enable transistor that receives the lock control signals and that selectively connects the third and fourth nodes together in response to the lock control signals.

9. The memory circuitry defined in claim 2 wherein the bistable memory cell comprises a pair of cross-coupled inverters, wherein at least one of the inverters contains a programmable Schmitt trigger circuit that is responsive to the lock control signals.

10. The memory circuitry defined in claim 9 wherein the inverter that contains the programmable Schmitt trigger circuit comprises:
a pair of p-channel transistors connected together in series; and
a pair of n-channel transistors connected together in series, wherein the pair of p-channel transistors and the pair of n-channel transistors are connected in series between a pair of power supply lines.

11. The memory circuitry defined in claim 10 wherein the inverter that contains the programmable Schmitt trigger comprises:
an additional p-channel transistor having a source-drain terminal connected to a node between the two p-channel transistors in the pair of p-channel transistors; and
an additional n-channel transistor having a source-drain terminal connected to a node between the two re-channel transistors in the pair of n-channel transistors.

12. The memory circuitry defined in claim 11 wherein the lock control path comprises first and second lock control lines, wherein the additional p-channel transistor has another source-drain terminal that is connected to the first lock control line, and wherein the additional n-channel transistor has another source-drain terminal that is connected to the second lock control line.

13. The memory circuitry defined in claim 12 wherein the additional p-channel transistor and the additional n-channel transistor each have a gate terminal that is connected to an output node that is between the pair of p-channel transistors and the pair of n-channel transistors.

14. A method of operating a memory element, comprising:
unlocking the memory element with locking circuitry in the memory element;
while the memory element is unlocked, loading data into the memory element using at least one address transistor that is separate from the locking circuitry; and
after the data has been loaded into the memory element, locking the memory element with the locking circuitry to prevent changes to the loaded data.

15. The method defined in claim 14 further comprising:
while the memory element is unlocked, clearing the memory element using a clear transistor before loading the data using the address transistor.

16. The method defined in claim 14 wherein the memory element comprises four transistor pairs that are interconnected to form a bistable memory cell, wherein the bistable memory cell has four nodes, each node being connected between an n-channel transistor and a p-channel transistor in a respective one of the transistor pairs, and wherein unlocking the memory element with the locking circuitry comprises:
electrically connecting at least two of the nodes together using at least one write enable transistor.

17. The method defined in claim 14 wherein the locking circuitry comprises programmable Schmitt trigger circuitry having an input and an output, wherein the output of the programmable Schmitt trigger circuitry switches from a logic one to a logic zero only after the input of the programmable Schmitt trigger circuitry is driven above a first threshold voltage, wherein the output of the programmable Schmitt trigger circuitry switches from a logic zero to a logic one only after the input of the programmable Schmitt trigger is driven below a second threshold voltage, and wherein unlocking the memory element comprises providing unlock control signals to the programmable Schmitt trigger that reduce the first threshold voltage and that increase the second threshold voltage.

18. The method defined in claim 17 wherein providing the lock control signals to the programmable Schmitt trigger circuitry that reduce the first threshold voltage and that increase the second threshold voltage comprises reducing the first threshold voltage and increasing the second threshold voltage so that the first and second threshold voltages are substantially equal when the memory element is unlocked.

19. The method defined in claim 17
wherein locking the memory element with the locking circuitry to prevent changes to the loaded data comprises providing lock control signals to the programmable Schmitt trigger circuitry that increase the first threshold voltage and the decrease the second threshold voltage so that the first threshold voltage is greater than the second threshold voltage when the memory element is locked.

20. A method of operating a memory element, comprising:
asserting an unlock control signal that unlocks the memory element;
while the unlock control signal is asserted, loading data into the unlocked memory element by asserting an address signal; and
after loading the data into unlocked memory element, deasserting the unlock control signal to lock the memory element to prevent changes to the loaded data.

21. The method defined in claim 20 further comprising:
while the unlock control signal is asserted and before loading the data into the unlocked memory element, asserting a clear signal and clearing the memory element.

22. A method of operating a memory element, comprising:
asserting an unlock control signal that unlocks the memory element; and
while the unlock control signal is asserted, loading data into the unlocked memory element by asserting an address signal, wherein the memory element comprises four transistor pairs that are interconnected to form a bistable memory cell, wherein the bistable memory cell has four nodes, each node being connected between an n-channel transistor and a p-channel transistor in a respective one of the transistor pairs, and wherein asserting the unlock control signal that unlocks the memory element comprises:
electrically connecting at least two of the nodes together using at least one write enable transistor.

23. The method defined in claim 20 wherein the memory element comprises a programmable Schmitt trigger circuit having an input and an output, wherein the output of the programmable Schmitt trigger circuit switches from a logic one to a logic zero only after the input of the programmable Schmitt trigger is driven above a first threshold voltage, wherein the output of the programmable Schmitt trigger switches from a logic zero to a logic one only after the input of the programmable Schmitt trigger is driven below a second threshold voltage, and wherein asserting the unlock control signal that unlocks the memory element comprises:
asserting a first unlock control signal to lower the first threshold voltage; and
asserting a second unlock control signal to increase the second threshold voltage.

* * * * *